United States Patent
Graham

(10) Patent No.: US 10,250,983 B1
(45) Date of Patent: Apr. 2, 2019

(54) DISTRIBUTED AND UPGRADABLE AUDIO SYSTEM

(71) Applicant: NIO USA, Inc., San Jose, CA (US)

(72) Inventor: Philip Roland Graham, Milpitas, CA (US)

(73) Assignee: NIO USA Inc., San Jose, CA (US)

( * ) Notice: Subject to any disclaimer, the term of this patent is extended or adjusted under 35 U.S.C. 154(b) by 0 days.

(21) Appl. No.: 15/705,500

(22) Filed: Sep. 15, 2017

(51) Int. Cl.
| | |
|---|---|
| *H04R 3/12* | (2006.01) |
| *G06F 3/16* | (2006.01) |
| *H04R 1/02* | (2006.01) |
| *H03F 3/183* | (2006.01) |

(52) U.S. Cl.
CPC .............. *H04R 3/12* (2013.01); *G06F 3/162* (2013.01); *H04R 1/028* (2013.01); *H03F 3/183* (2013.01); *H03F 2200/03* (2013.01); *H04R 2420/09* (2013.01); *H04R 2499/13* (2013.01)

(58) Field of Classification Search
CPC ............... G11B 19/02; H04N 21/436; H04N 21/43615; H04R 3/12; H04R 29/002; H04R 1/026; B60R 11/0217
USPC ...... 342/27; 348/14.04; 369/30.07; 370/450; 381/1, 17, 58, 60, 86, 101; 386/239; 455/73; 700/94; 701/36; 705/4
See application file for complete search history.

(56) References Cited

U.S. PATENT DOCUMENTS

| | | | | |
|---|---|---|---|---|
| 5,485,459 | A * | 1/1996 | Van Steenbrugge | H04B 1/207 370/450 |
| 5,754,664 | A * | 5/1998 | Clark | B60R 11/0217 296/214 |
| 6,377,695 | B1 | 4/2002 | Azima et al. | |
| 6,501,415 | B1 * | 12/2002 | Viana | B60K 31/0008 342/175 |
| 6,721,436 | B1 | 4/2004 | Bertagni et al. | |
| 7,415,116 | B1 * | 8/2008 | Fels | B60R 11/02 381/86 |
| 8,140,358 | B1 * | 3/2012 | Ling | G06Q 40/08 340/439 |
| 8,594,341 | B2 * | 11/2013 | Rothschild | H04H 60/04 381/123 |
| 8,848,938 | B2 | 9/2014 | Opfer | |
| 9,331,864 | B2 | 5/2016 | Braithwaite et al. | |
| 9,725,047 | B2 * | 8/2017 | Orellana | B60R 11/0217 |

(Continued)

FOREIGN PATENT DOCUMENTS

DE  19933067  2/2001

OTHER PUBLICATIONS

International Search Report and Written Opinion for International Patent Application No. PCT/US18/50992, dated Dec. 6, 2018, 8 pages.

*Primary Examiner* — Gerald Gauthier
(74) *Attorney, Agent, or Firm* — Sheridan Ross P.C.

(57) ABSTRACT

The systems and methods described herein provide an audio system and modules that include speakers that can be packaged in new locations, and/or that can be driven by a local amplifier (amp). The new audio system can be easily upgraded with more modules inserted into the speaker network. For example, the custom system can increase capacity by replacing a trim panel with a new integrated trim panel having a module with one or more smaller speakers and the local amp. A control processor can detect the modules, which may include a digital signal processor (DSP), an amp, and/or at least one speaker.

20 Claims, 8 Drawing Sheets

(56) References Cited

U.S. PATENT DOCUMENTS

| | | | |
|---|---|---|---|
| 2003/0223320 A1* | 12/2003 | Sugino | G11B 20/10527 369/30.07 |
| 2003/0231872 A1* | 12/2003 | Denda | G11B 20/10009 386/239 |
| 2005/0259831 A1* | 11/2005 | Hutt | H04R 1/345 381/86 |
| 2006/0002567 A1* | 1/2006 | Yusa | H04S 3/008 381/58 |
| 2007/0135061 A1* | 6/2007 | Buck | H04M 1/6083 455/73 |
| 2008/0192953 A1* | 8/2008 | Opfer | H04R 5/02 381/86 |
| 2008/0240452 A1* | 10/2008 | Burrows | H04R 25/30 381/60 |
| 2009/0110211 A1 | 4/2009 | Feit | |
| 2009/0299572 A1* | 12/2009 | Fujikawa | G01C 21/26 701/36 |
| 2010/0260348 A1 | 10/2010 | Bhow et al. | |
| 2011/0109714 A1* | 5/2011 | Momose | H04N 7/163 348/14.04 |
| 2012/0213375 A1* | 8/2012 | Mahabub | H04S 5/00 381/17 |
| 2014/0029763 A1 | 1/2014 | Takada et al. | |
| 2016/0337772 A1* | 11/2016 | Bothe | H04R 29/002 |
| 2017/0142508 A1* | 5/2017 | Prommersberger | H04R 1/026 |

\* cited by examiner

DISTRIBUTED AND UPGRADABLE AUDIO SYSTEM

FIELD

The present disclosure is generally directed to vehicle systems, in particular, toward vehicle audio systems.

BACKGROUND

In recent years, transportation methods have changed substantially. This change is due in part to a concern over the limited availability of natural resources, a proliferation in personal technology, and a societal shift to adopt more environmentally friendly transportation solutions. These considerations have encouraged the development of a number of new flexible-fuel vehicles, hybrid-electric vehicles, and electric vehicles.

Further, the development of infotainment systems in vehicles has progressed rapidly. The infotainment systems generally include at least some audio component that provides sound output for the vehicle. However, the audio systems in vehicles have changed little. In most audio systems, an amplifier sends an analog signal to analog speakers that are placed in a few typical places (e.g., the doors, the dash, etc.). The speakers tend to be larger as only a few powerful speakers are used in the audio systems. Some systems attempt to provide more realistic audio by adding large numbers of large speakers with bigger amplifiers, but this approach takes space away from passenger comfort. Traditional speakers are large, require more power, and are difficult to package in the vehicle with the associated cables going to each speaker, where each wire is designed to handle the power for that the speaker. Further, the speaker wires radiate outward from the amplifier in a star configuration from the amplifier to each speaker. A significant amount of wire is used to connect the central amplifier to the speakers. This wiring configuration and configuration of these audio systems add weight to the vehicle and provide little to no customization.

DETAILED DESCRIPTION

Figure 1:
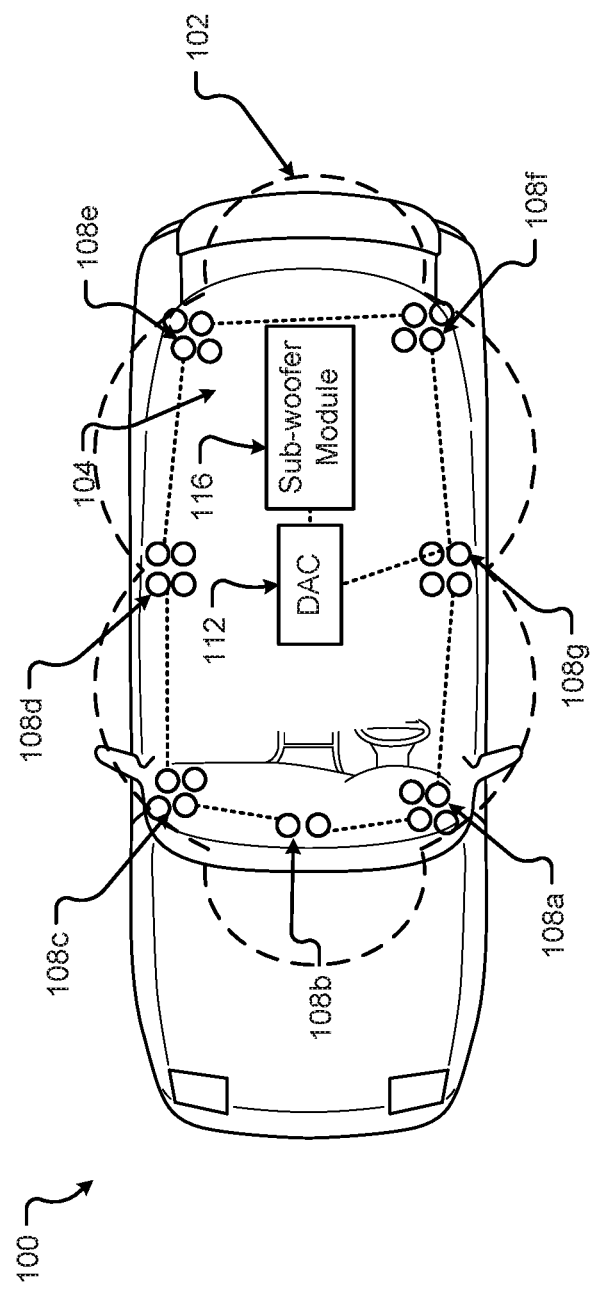
FIG. 1 shows an interior of a vehicle in accordance with embodiments of the present disclosure.

Embodiments of the present disclosure will be described in connection with a vehicle, and in some embodiments, an electric vehicle, rechargeable electric vehicle, and/or hybrid-electric vehicle and associated systems. Some embodiments relate to an audio system in a vehicle.

Traditional automotive audio systems use discrete speakers in doors, on the front dash, on the rear dash, etc., with a central amplifier located someplace in the vehicle. Sometimes a sub-woofer will be added with a second discrete amplifier. Unlike this approach, embodiments herein combine a range of technologies to create a system that is easier to package, install, configure, and modify in the vehicle. Further, customization or changes to the audio system after production of the vehicle is a difficult process. Speakers can be changed out in a modification, but adding new speakers would require a new wiring harness, new amplifiers, new interior finish, routing the wires inside of the vehicle is very difficult.

In the embodiments herein, the modules that include the speakers that may be smaller units, that can be packaged in new locations, and/or that can be driven by a local amplifier (amp). Thus, the new audio system can be easily upgraded with more modules inserted into the speaker network. For example, the custom system can increase capacity by replacing a trim panel with a new integrated trim panel having a module with one or more smaller speakers and the local amp. A control processor can detect the modules, which may include a digital signal processor (DSP), an amp, and/or at least one speaker. These modules may be referred to as DSP, amp, speaker (DAS) modules. The DAS modules 108 may be placed throughout the vehicle and may communicate with a central controller or unit, which can configure an audio signal and distribute the configured signal to the remote DAS modules 108.

Further, a software configuration can change the output capabilities of the audio system. For example, the subwoofer could be capable of 200 W power but, with minimum configuration changes, the subwoofer can be configured to 100 W power. Other software features could also be enabled by the central controller, also referred to as a digital audio controller (DAC). For example, the Audio Control Processor (ACP) of the DAC can configure the DASs for 3D audio (such as DTS:X 3D or Dolby Atmos) or other types of audio effects or processing. The audio signal can be sent to each DAS module as a digital signal sent over an audio network. In some configurations, each individual speaker in each DAS could be addressed individually to create new kinds of audio experiences or effects relating to vehicle operation.

The embodiments herein can be a modular, reconfigurable audio system. For example, rather than relying on conventional complex runs of speaker wire installed throughout a vehicle (to multiple static speaker locations), the embodiments, among other things, can include a network backbone and incorporate a series of small amp/speaker modules (DAS) that can be installed, detected, and controlled in concert, by the DAC, (e.g., via a stereo control processor, etc.) to form different speaker effects in a particular zone (e.g., recruiting different numbers of DAS modules 108 to form a virtual static speaker, etc.), to generate various channel surround sound configurations, and more. The system can also provide different audio effects (e.g., digitally moving audio around the vehicle—steerable audio, directionality of zones, sweeping experience, etc.) to enhance the user experience. Still further, the embodiments presented herein are easier to build and install in the vehicle.

An embodiment of a vehicle 100 may be as shown in FIG. 1. The vehicle 100 is shown with the interior 104 exposed. The interior 104 of the vehicle 100 can include the passenger compartment where the passengers either drive and/or are transported within the vehicle 100. The interior of the vehicle 100 may include an entertainment, infotainment, and/or audiovisual system that includes one or more speakers. These speakers may be positioned around the vehicle 100 in speaker clusters 108A through 108G, also referred to as DAS modules 108.

A DAS module 108 can be a set of one or more speakers associated with a position in the vehicle 100 and/or electronics dedicated to the DAS module 108 as explained hereinafter in FIGS. 2A through 2B. A DAS module 108 can be positioned to provide the best amount of sound, to provide the best user experience, and/or to provide the easiest installation or configuration. Each speaker in the DAS module 108A may be a smaller than normal-sized speaker, but a DAS module 108 can include two or more speakers and can include more speakers in a location than is typically found in a vehicle 100.

The DAS modules 108A through 108G can be controlled by a digital audio controller (DAC) 112. The DAC 112 can receive audio signals from one or more input devices usually digitally, but could be analog and converted to digital in the DAC, examples include FM, AM, storage device (e.g., a memory, an iPod, etc.), a compact disc (CD), or other types of devices or storage media that can provide an audio signal to the DAC 112. The DAC 112 may then provision the sound signal based on channel information or other metadata into one or more signals that can be sent and, in at least some configurations, separately addressed to each of the separate DAS modules 108A through 108G. Thus, the DAC 112 can receive information about, determine, or gain insight into the arrangement of the DAS modules 108A through 108G and provide sound to each of the DAS modules 108 discretely to provide an enveloping sound experience that appears to the user to have numerous channels or effects. Semiconductors, Systems-On-Chip (SOC), devices, components, etc. can provide the functionality described herein. The DAC 112 can be, for example, the dB Technologies AC26N Digital Audio Controller, a BD37069FV-M from Rohm Semiconductor, a PCM9211 from Texas Instruments, etc.

The audio system 102 may also include a subwoofer module or other types of devices 116 that provide low to midfrequency sound signals. As the low to mid frequency signals require larger speakers, there may be fewer of the subwoofers modules 116, and the subwoofers 116 may be directly connected to the DAC 112, as shown by the dashed line in FIG. 2A. Some configurations might have two or more subwoofer modules 116, which can be located in several different physical locations (e.g., at the corners of the interior space 104 being occupied), in the vehicle 100, to enrich the overall audio experience. The subwoofer modules 116 may also be part of the vehicle audio network 206, as shown in FIG. 2A.

The DAS modules 108 can be arranged in a ring or other type of network and connected to the DAC 112. In this way, a single strand of cable circling the interior of the vehicle 100 can be connected sequentially or in parallel to each of the different DAS modules 108 and to the DAC 112. This ring configuration eliminates the need for heavy audio copper wiring to be placed from the DAC 112 to each of the DAS modules 108 in the star pattern mentioned above. There may be more or fewer DAS modules 108 than that shown in FIG. 1, as will be understood in the further description of the audio system 102.

In at least some configurations, the audio system 102 can be easily upgraded. For example, if the original audio system only included clusters 108a 108c 108e, and 108f, new clusters 108b, 108d, 108g could be easily added with each new cluster having a new amplifier and speakers. The new clusters 108b, 108d, 108g would be integrated into the existing network and receive power from a power source in physical proximity to the cluster. Further, if one or more of the clusters 108 include only two speakers, new small speakers could be added to the clusters by attaching the speakers to the existing amplifiers in the cluster. Thus, no new wiring need be routed from the new speakers or clusters to the DAC 112, which greatly reduces the effort in upgrading or changing the audio system 102.

Figure 2A:
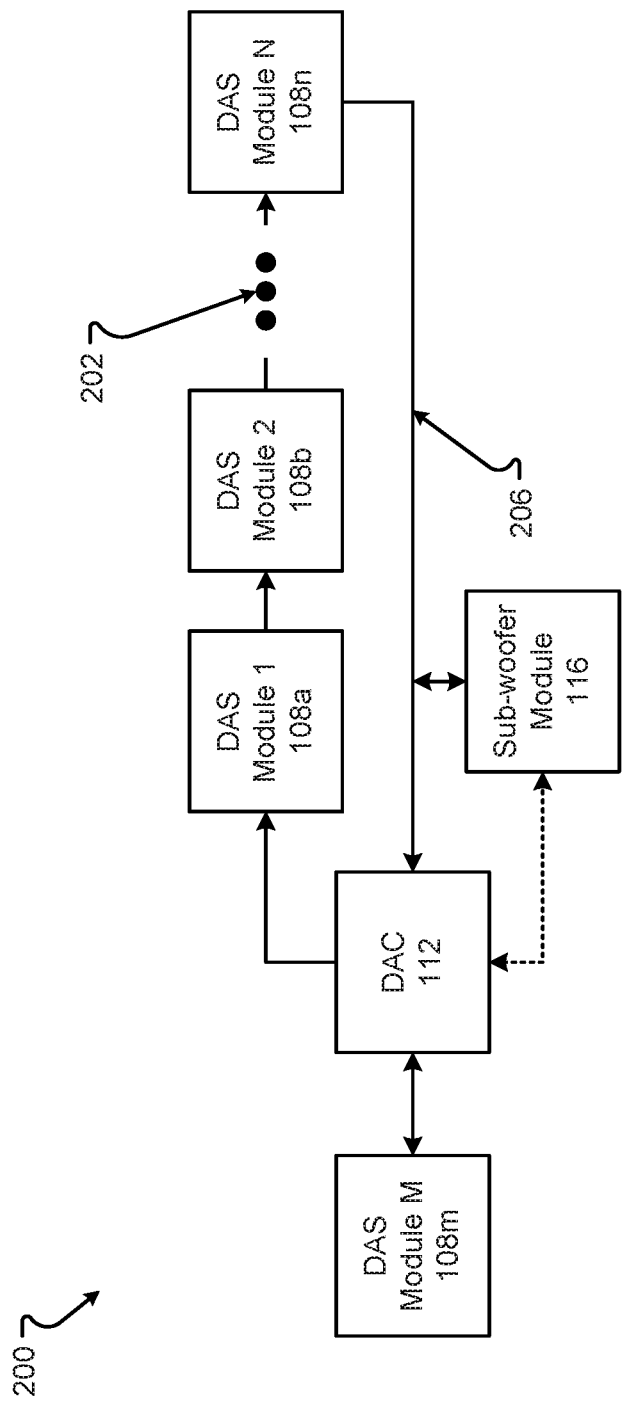
FIG. 2A shows is a block diagram of an embodiment of an audio system for the vehicle in accordance with embodiments of the present disclosure.

An electrical diagram 200 of the audio system 102, shown in FIG. 1, may be as provided in FIG. 2A. The electrical diagram 200 can include the one or more DAS modules 108A through 108B. Each DAS module 108 may be the same or similar to the DAS module 108 described in conjunction with FIG. 2B. There may be more or fewer DAS modules 108, as explained previously, as represented by ellipses 202. The DAC 112 may be connected through a ring network or some other type of network, as shown in FIG. 2A. The network 206 may include cables connected sequentially to each the DAS modules 108, which can reduce the weight of wiring within the vehicle 100. Further, the network 206 can allow for the provision of digital audio signals to each of the DAS modules 108 to allow each DAS module 108 to be separately identified as a channel or for use in specific audio features or effects, such as providing echoes, sequential signals, sound movement, sound location, etc. One or more DAS modules, e.g., DAS module 108M, can be directly connected to the DAC 112. Similarly, the woofer or subwoofer 116 can be directly connected to the DAC 112. However, DAS module 108M and/or woofer or subwoofer 116 can also be provided in the ring network 206 and not directly connected, in some configurations.

Figure 2B:
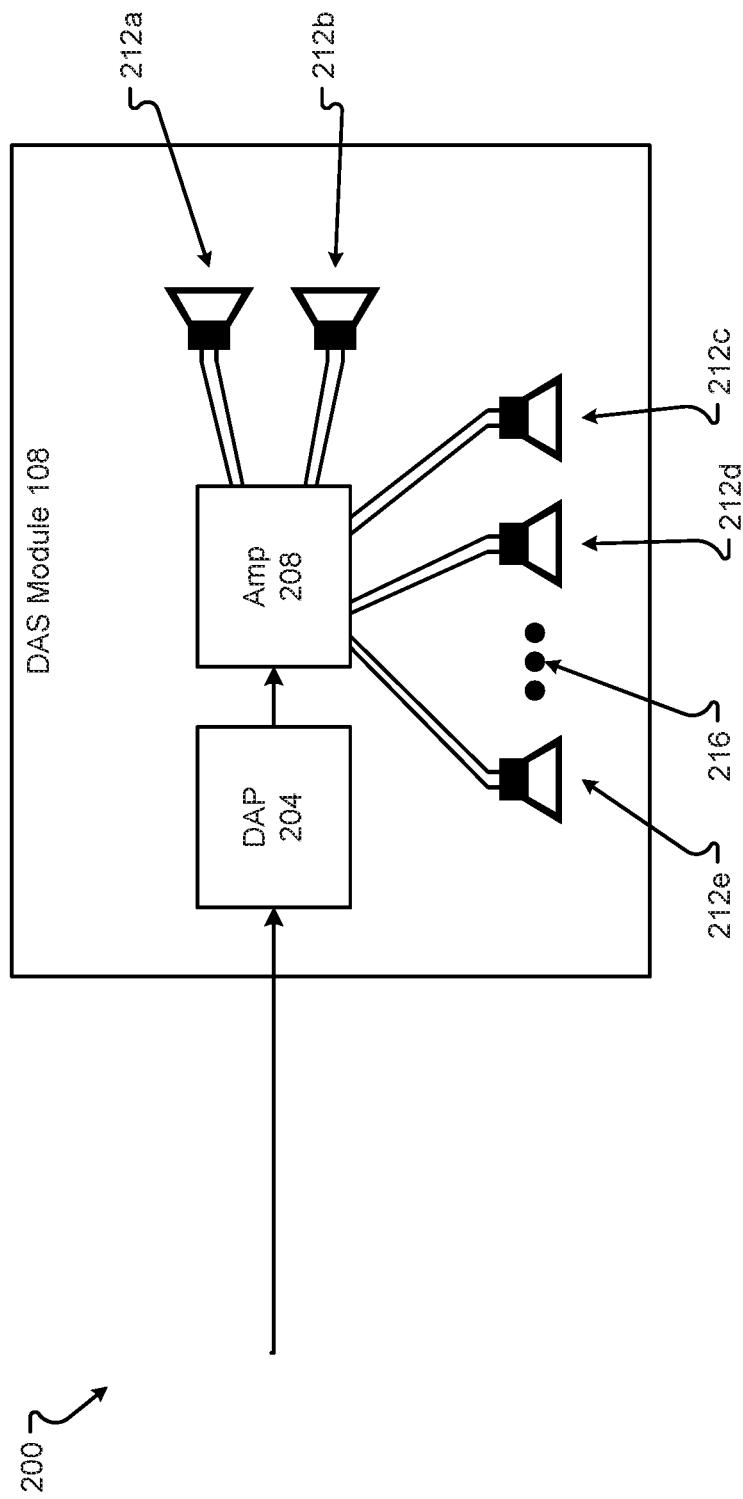
FIG. 2B is a block diagram of an embodiment of a speaker cluster in the audio system of the vehicle in accordance with embodiments of the present disclosure.

An embodiment of a DAS module 108 may be as shown in FIG. 2B. The DAS module 108 can be a grouping of a digital audio processor (DAP) 204, which may be a digital signal processor (DSP), an amp 208, and one or more speakers 212. Each speaker 212A through 212N may be connected to one or more amplifiers 208. The amplifier 208 may be smaller than a typical amplifier used within the vehicle 100 as each of the speakers 212 may be a smaller version of a speaker than that normally used in the vehicle 100. As such, the components shown in the DAS module 108 may be miniaturized.

An example of a typical speaker that may be used in a DAS module 108 can be a subminiature speaker, such as those used by small portable audio speakers. The amp 208 may also be a small or miniaturized version of an amplifier. The amplifier 208 can be connected to a digital signal processor 204. The DAP 204 can receive the digital signal from the DAC 112. The DAP 204 can be a SOC with audio processing capabilities. The DAP 204 can then convert the digital signal to an analog signal and thus can include a digital audio converter that can provision the analog audio signal to the amplifier(s) 208 to amplify the analog signal and then send the signal(s) to the speakers 212a-212e (there may be more or fewer speakers 212 than those shown in FIG. 2B, as represented by ellipses 216). Thus, the processing of the digital audio signal at the DAS module 108 eliminates the need for electrical wiring to carry the analog signal from a central amplifier to each speaker.

The audio controls can also be changed based on where the DAS module 108 is located in the vehicle 100. In this way, the DAS modules 108 may be provisioned throughout the vehicle 100 in locations not normally associated with speakers, for example, in the headliner, in the head unit, in a central console unit, in seats, in the floor, or in other areas of the vehicle 100. Further, DAS modules 108 can also be provisioned in locations normally associated with speakers such as the doors, in the dash, or in the back column or pillars. Further, due to the miniaturized form factor of the DAS modules 108, there may be more speakers within the vehicle 100, which allows for an expanded ability to have different types of sound effects produced within the vehicle 100. Generally, the speakers 212 may be smaller wattage speakers and thus use less power, and the DAS modules 108 may extract that required power from power sources closer to the DAS module 108 rather than having the power wired from the DAC 112 or a central area.

Figure 3A:
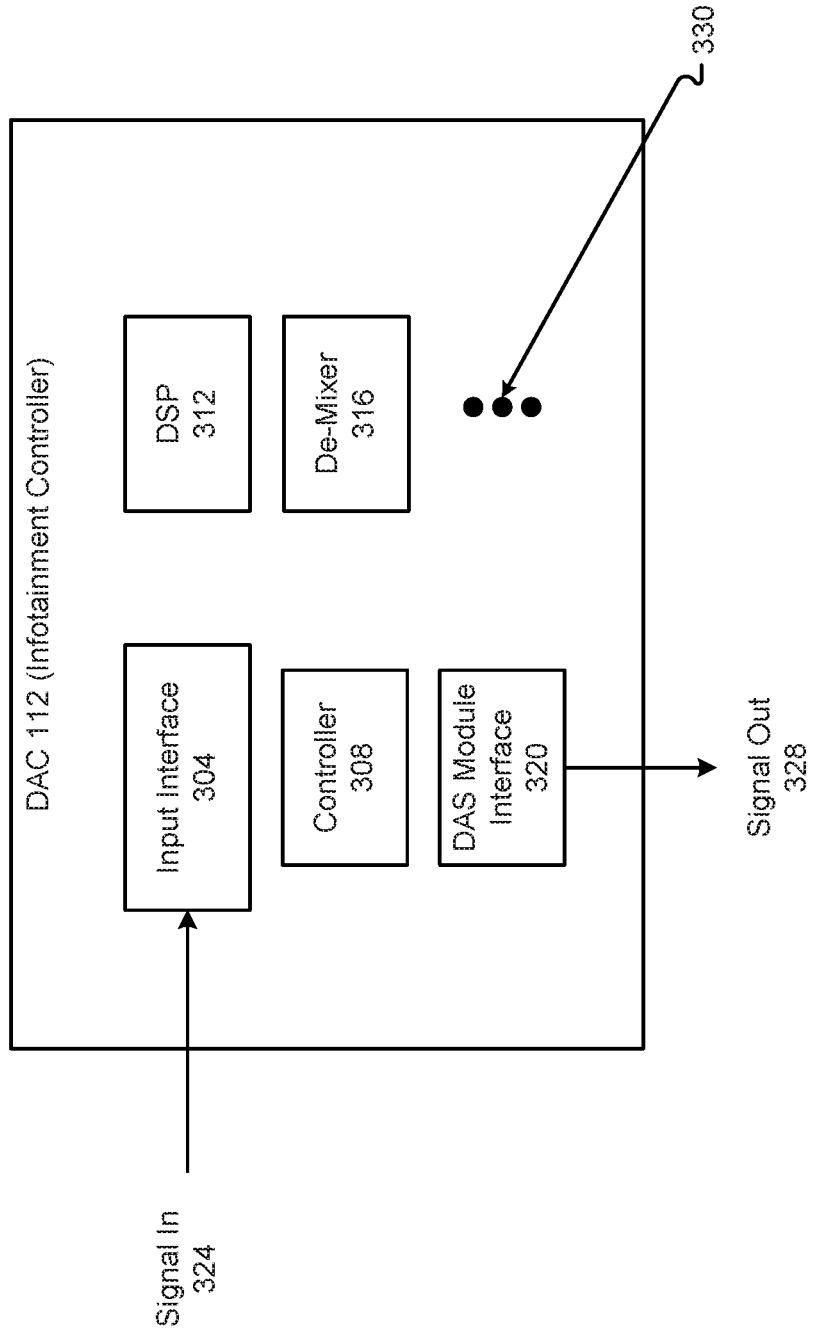
FIG. 3A is a block diagram of an embodiment of a digital audio controller (DAC) in the audio system of the vehicle in accordance with embodiments of the present disclosure.

An embodiment of a DAC 112 (which may be a portion of an infotainment controller) may be as provided in FIG. 3A. The DAC 112 can be any hardware, software, or combination of software and hardware that performs the functions described herein. The DAC 112 can include one or more of, but is not limited to, a radio interface/input interface 304, a controller 308, a DAS module interface 320, a digital signal processor 312, and/or a de-mixer 316. The DAC 112 may include more or fewer components than those shown in FIG. 3A, as represented by ellipses 330.

The DAC 112 can receive an input signal 324 at an input interface 304. Thus, the input interface 304 can receive audio signals from a head unit or infotainment system. The input interface 304 may thus provide the input signal 324 to one or more of the various components of the DAC 112.

The controller 308 may perform processing on the received signal and can extract any type of metadata associated with the digital or analog input signal. Further, any analog input signal can be provided to a digital signal processor 312 to be converted to a digital signal with an analog to digital converter (ADC). Further, the controller 308 can send the input signal to a de-mixer 316 or other sound processor, which can separate the input audio signal into various channels or separate signals that can be provisioned separately to the different DAS modules 108. Further, the controller 308 can send the input signal 324 to the digital signal processor 312 to create separate effects not normally provisioned with the input audio signal 324. After mixing and/or processing the signal, the controller 308 can send the one or more signals to the different DAS modules 108 by addressing each separate signal for a particular DAP 204. Thus, each DAP 204 may be separately identifiable, addressable, and/or signaled to customize how the audio signal is processed by the set of DAS modules 108.

The separate signals may then be provided to the DAS module 108 interface 320, which can multiplex or conduct other operations to create a signal out 328. This signal 328 may then be sent on the ring network 206 and to the various DAS modules 108 to provide sound within the vehicle 100. The signal out 328 may also be a digital signal and thus received and processed by the DAP 204 of the DAS module 108.

Figure 3B:
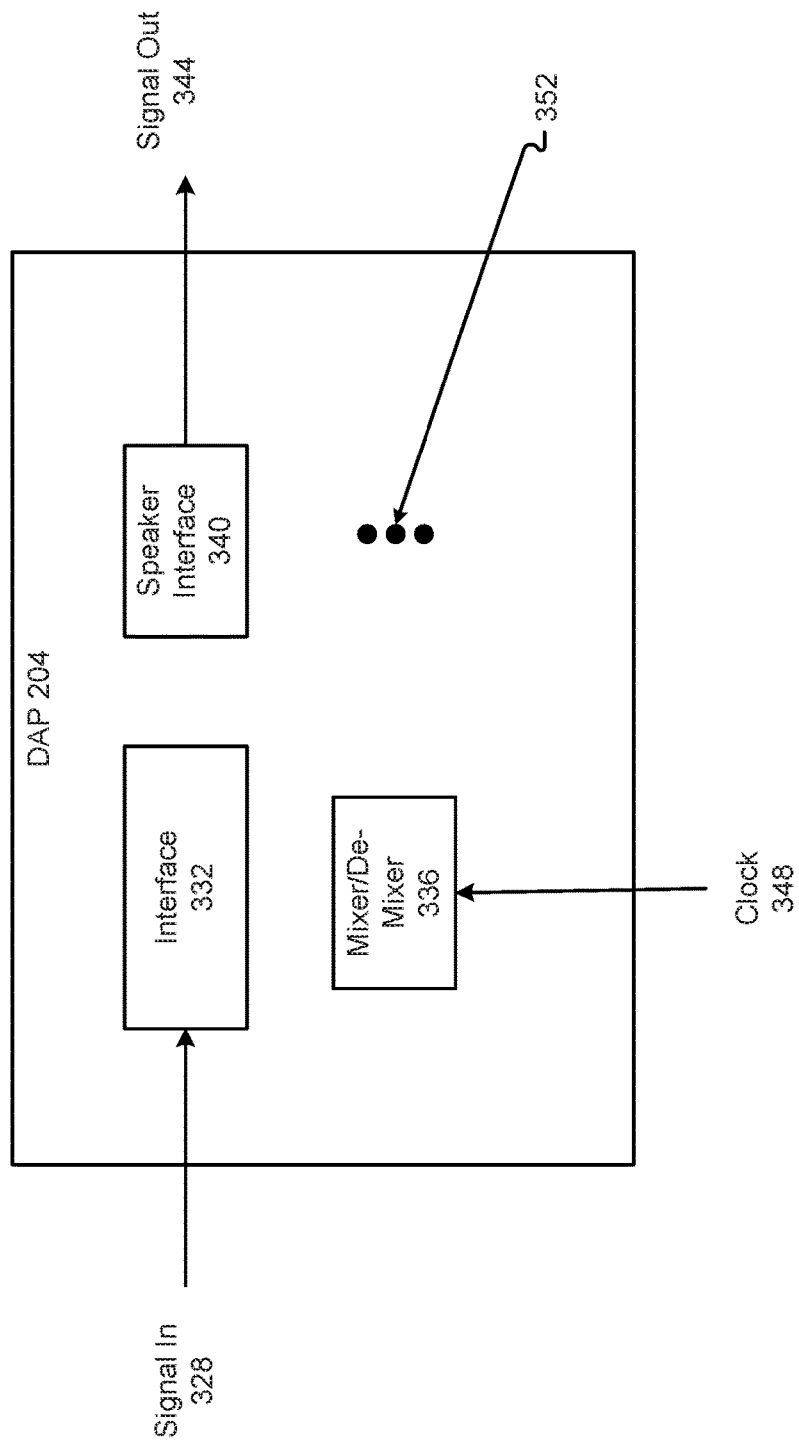
FIG. 3B is a block diagram of an embodiment of a digital audio processor (DAP) module in the audio system of the vehicle in accordance with embodiments of the present disclosure.

An example of a DAP 204 may be as shown in FIG. 3B. The DAP 204 can also be any hardware, software, or combination of software and hardware that performs the functions described herein. The DAP 204 can include one or more of, but is not limited to, an interface 332, a mixer/de-mixer 336, and/or a speaker interface 340. The DAP 204 may include more or fewer components than those shown in FIG. 3B, as represented by ellipses 352.

The interface 332 can receive the signal 328 from the DAC 112. The interface 332 can determine if the signal is addressed to the particular DAP 204. The interface 332 thus may have knowledge or access to the address or identifier (ID) of the DAP 204 and search for such ID in the signal 328. If such ID is found, the interface 332 can extract the digital audio content and provide that digital signal to the de-mixer 336 and/or speaker interface 340. Thus, the interface 332 can include a demultiplexer or some other type of digital audio interface to extract particular parts of the signal 328 destined for the digital signal processor 204.

A mixer/de-mixer 336 can provide any type of processing, including mixing different types of digital audio signal or providing other types of processing specific or required by the DAC 112. Thus, the DAC 112 can provide, through the controller 308, signals to the mixer/de-mixer 336 to change the audio signal in some way to provide certain sound effects within the vehicle 100. The mixer/de-mixer 336 may then change the audio signal as necessary before sending the altered signal to the speaker interface 340. Further, the de-mixer/mixer 336 and/or the interface 332 can receive a clock 348 that can synchronize the output of the signal 344 in respect with all other DAS modules 108. The clock 348 syncs the audio effects provided by the controller 308 and created by the mixer/de-mixer 336.

The speaker interface 340 can include a digital audio converter (DAC) and/or other types of processing that turns the digital audio signal from the interface 332 and/or mixer/de-mixer 336 into an analog signal for the one or more speakers 212. This analog output audio signal 334 may then be provided over copper or other types of electrical conductors to the speakers 212. In at least some configurations, the output 344 may then be provided to the amp(s) 208, which then can amplify the signal for the speakers 212. The provision of the digital signal processing in the DAS module 108 allows for a minimum run of heavier electrical conductor, like copper, to the speakers 212.

Figure 4:
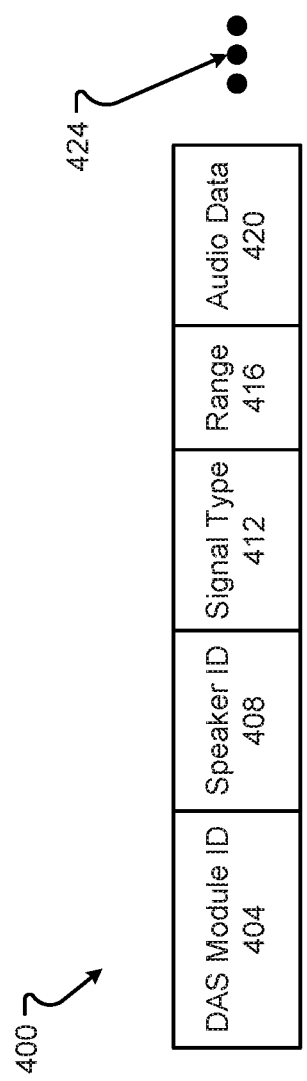
FIG. 4 is a data diagram showing data that that may be stored, retrieved, exchanged, etc. in the systems and/or environments described herein in accordance with embodiments of the present disclosure.

An embodiment of a data structure 400 which may represent one or more of the signals provided within the audio system 102 may be as shown in FIG. 4. The audio signal 400 may include one or more of, but is not limited to, a DAS module identifier (ID) 404, a speaker ID 408, a signal type 412, a range 416, audio data 420. There may be more or fewer fields provided in the data structure 400 than those shown in FIG. 4, as represented by ellipses 424.

A DAS module ID identifier 404 can be any identifier that can identify the DAS module 108. The DAS module ID 404 can be an alphanumeric ID, a numeric ID, a globally unique identifier (GUID), a URL, a MAC address, or some other type of ID that identifies the DAS module 108. In some configurations, the DAS module ID 404 can identify the particular digital signal processor 204 associated with the DAS module 108. Thus, the DAS module ID 404 can act as a signal to the DAP 204 that the audio data contained within the data structure 400 or at least a portion of the data structure may be assigned or directed to that specific DAP 204. This identification allows the DAP 204 to extract the audio data 420 associated with that DAS module ID 404 for provision to the amplifier 208 and/or speakers 212.

In some configurations, each speaker 212, within the DAS module 108, may be separately identified. Thus, the data structure 400 can also include a speaker identifier (ID) 408. The speaker ID 408 can also be some type of alphanumeric, numeric, GUID, MAC address, etc. that is assigned to a specific speaker 212. The speaker ID 408 may thus allow the DAC 112 to create particular sound effects by assigning specific audio data to different speakers 212 assigned to a single DAS module 108 rather than to all speakers associated with a DAS module 108.

A signal type 412 can be a description of or assignment of a type of signal. Types of signals can include, for example, emergency signals, which can preempt any other type of signal or may direct the DAP 204 to send that signal to the amplifier 208 in a certain format. An emergency signal may have a louder volume or require maximum output from the amplifier 208. Further, there may be separate signals provided simultaneously to the DAS module 108. The signal type 412 allows for the DAP 204 to determine the best process for outputting those signals. Signal types can also include input sources or other bass, treble, or other audio-type manipulations of the data or audio content.

A range 416 can include the frequency or audible range of the audio content. For example, if the speakers 212 are not separately identified, the range 416 can provide insight to the DAP 204 as to which speaker 212 the signal should be sent. For example, if one speaker is dedicated to treble and another to bass, the range 416 can indicate which speaker 212 the audio content should be sent to.

Audio data 420 includes the actual audio signal, which may be in any type of format including MP3, MP4, or other types of audio signal formats. This audio data 420 may be sent to the mixer/de-mixer 336 or the speaker interface 340 to produce the analog audio signals sent to the one or more speakers 212.

Figure 5:
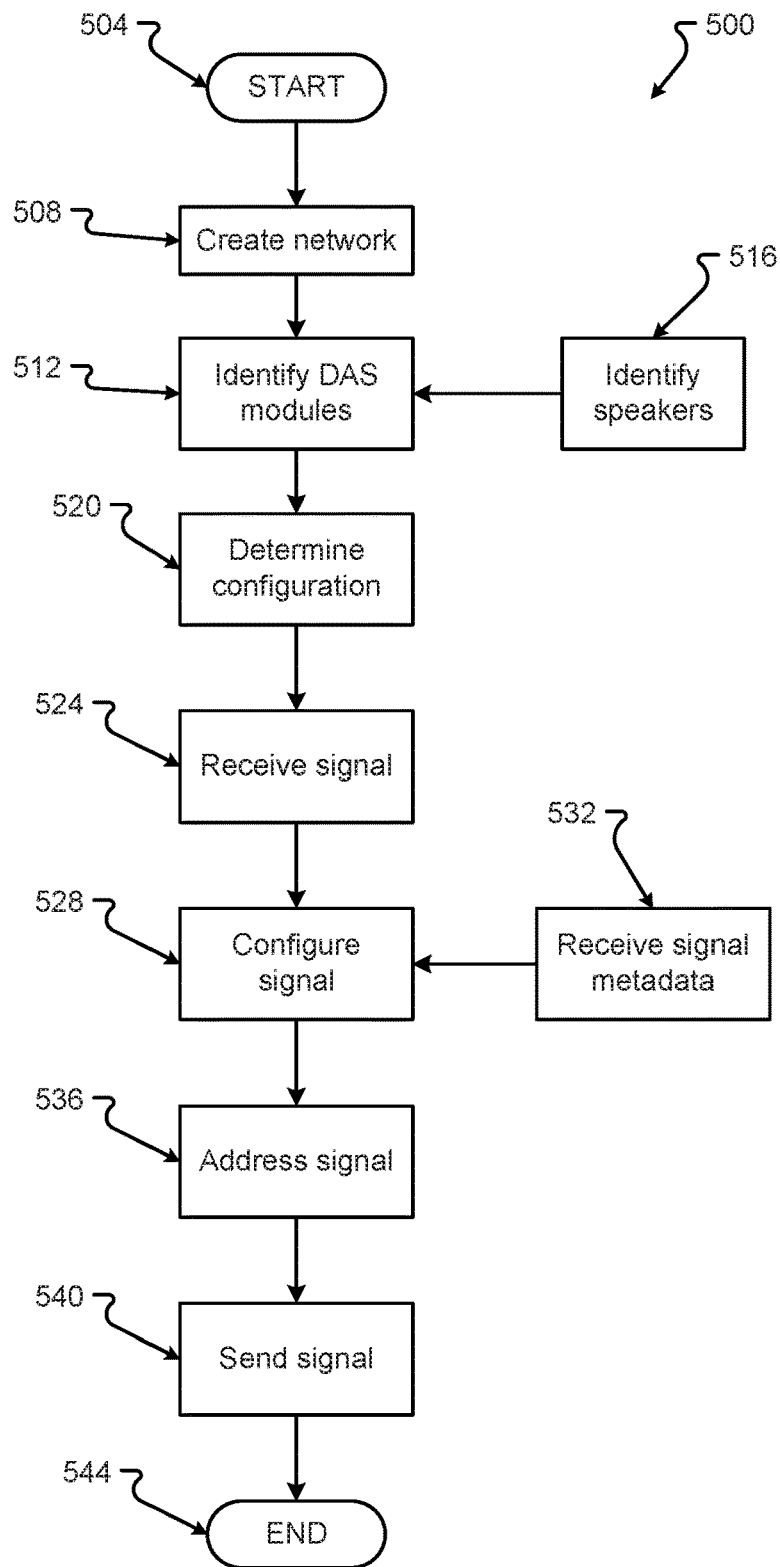
FIG. 5 is a flow diagram of an embodiment of a method for providing an audio output in a vehicle in accordance with embodiments of the present disclosure.

A method 500 for operating the audio system as provided herein may be as shown in FIG. 5 in accordance with embodiments of the present disclosure. A general order for the steps of the method 500 is shown in FIG. 5. Generally, the method 500 starts with a start operation 504 and ends with operation 544. The method 500 can include more or fewer steps or can arrange the order of the steps differently than those shown in FIG. 5. The method 500 can be executed as a set of computer-executable instructions executed by the DAC 112 or processor associated therewith and encoded or stored on a computer readable medium. In other configurations, the method 500 may be executed by a series of components, circuits, gates, etc. created in a hardware device, such as a System of Chip (SOC), Application Specific Integrated Circuit (ASIC), and/r a Field Programmable Gate Array (FPGA). Hereinafter, the method 500 shall be explained with reference to the systems, components, circuits, modules, software, data structures, signaling processes, models, environments, vehicles, etc. described in conjunction with FIGS. 1-4.

An audio network 102 may be created, in step 508. The network 102 can be created by installing and/or provisioning one or more DAS modules 108 within the interior 104 of the vehicle 100. Each of these DAS modules 108 may include one or more different speakers, a digital signal processor 204, an amplifier 212, and/or other types of devices or electronics. Each DAS module 108 may be connected to the DAC 112 through a fiber optic network or other type of network 206. These connections, once the DAS module 108 and the DAC 112 are provided with power, can form the audio network 102 within the vehicle 100.

The DAC 112 may automatically, or through the reception of information from an external source, identify the one or more DAS modules 108 within the vehicle 100, in step 512. The DAC 112 can produce sound signals automatically to the one or more DAS modules 108 to identify which and how may DAS modules 108 are present, what speakers 212 may be assigned to each of those DAS modules 108, a location of the DAS module 108, or any other type of information through the monitoring of output sound sent to those different DAS modules 108 and/or some other type of test configuration conducted automatically by the DAC 112. In other configurations, the information is provided by a manufacturer or other outside source to the DAC 112 for storage in some type of memory. Further, the DAC 112 may also identify one or more speakers 212 that are associated with each DAS module 108 either through some automatic test configuration or through reception of this information from an outside source. Thus, identifying the speakers, in step 516, may be conducted by similar processes or steps as identifying the DAS modules 108 that occurs in step 512.

In step 520, the DAC 112 and/or DAP 204 can determine a configuration of the DAS modules 108 and/or the speakers 212 within each of the DAS modules 108. This configuration can include the physical positioning, within the vehicle 100, of each of the one or more speakers 212 associated with the DAS module 108 and the physical locations of the DAS modules 108 within the vehicle interior 104. This configuration may be stored and used by the DAC 112 and/or DAP 204 to manipulate the audio signal to better configure that signal for the particular vehicle 100 and the location of the DAS modules 108 and speakers 212.

In step 524, the DAC 112 can receive the audio signal 324 from some audio input device. This audio signal may be an analog and/or digital signal. The signal may be received by radio interface/input interface 304 and provided to a controller 308. Further, the DAC 112 can receive signal metadata, in step 532. The signal metadata defines how the audio signal is to be presented to the occupants of the vehicle 100. The signal metadata can be received as a separate part of the audio signal received in step 524.

The controller 308 can address the signal for the one or more DAS modules 108, in step 536. Here, the controller 308 can divide the signal into portions or duplicates and assign a DAS module ID 404, speaker ID 408, and other metadata or other types of information, such as the signal type 412 or range 416 to the output signal 328. The controller 308 may then append the audio data 420 for that specific DAS module 108. These different signals may be then sent to the DAS module 108 interface 320 to multiplex or combine the signals into a single stream 328 to be sent out to the DAPs 204 of the different DAS modules 108. The DAS module interface 320 may then send the signal, in step 540.

Figure 6:
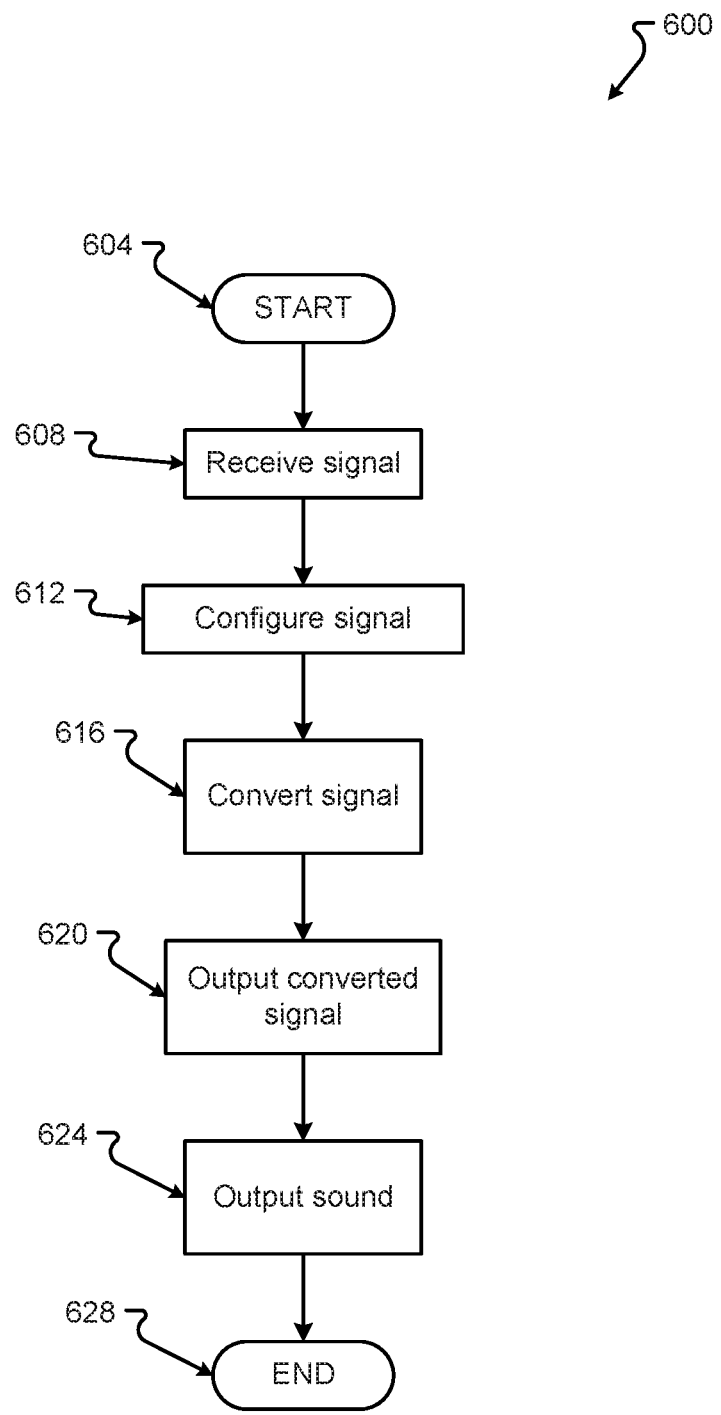
FIG. 6 is a flow diagram of an embodiment of a method for providing an audio output in a vehicle in accordance with embodiments of the present disclosure.

An embodiment of a method conducted by the DAP 204 of the DAS module 108 may be as shown in FIG. 6 in accordance with embodiments of the present disclosure. A general order for the steps of the method 600 is shown in FIG. 6. Generally, the method 600 starts with a start operation 604 and ends with operation 628. The method 600 can include more or fewer steps or can arrange the order of the steps differently than those shown in FIG. 6. The method 600 can be executed as a set of computer-executable instructions executed by the DAP 204 or processor associated therewith and encoded or stored on a computer readable medium. In other configurations, the method 600 may be executed by a series of components, circuits, gates, etc. created in a hardware device, such as a System of Chip (SOC), Application Specific Integrated Circuit (ASIC), and/r a Field Programmable Gate Array (FPGA). Hereinafter, the method 600 shall be explained with reference to the systems, components, circuits, modules, software, data structures, signaling processes, models, environments, vehicles, etc. described in conjunction with FIGS. 1-5.

In step 608, the interface 332 of the DAP 204 can receive signal 328. The signal 328 may be as shown in FIG. 400 or as explained in conjunction hereinbefore. The interface 332 can determine if a DAS module ID 404, contained in signal 328, is directed to the ID of the DAS module 108 or an ID of the DAP 204. If such ID is found, the signal 328 may be then passed to the de-mixer/mixer 336.

The de-mixer/mixer 336 can then receive a clock 348 and configure the signal 328, in step 612. Here, the signal configuration can include modifying the signal by parsing the signal 328 into portions based on speaker ID 408, signal type 412, range 416, or other metadata. Thus, any type of manipulations required by the DAC 112 may be conducted by the mixer/de-mixer 336 to create a converted signal which is then sent to the speaker interface 340.

The speaker interface 340 then can convert the signal from digital to analog. This converted signal may then be output as signal 344, in step 620. One or more speakers 212 may receive at least a portion of the converted digital signal. This converted digital signal or analog signal received by the speakers 212A through 212N can then be output as sound, in step 624.

Any of the steps, functions, and operations discussed herein can be performed continuously and automatically.

The exemplary systems and methods of this disclosure have been described in relation to vehicle systems and electric vehicles. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

Furthermore, while the exemplary embodiments illustrated herein show the various components of the system collocated, certain components of the system can be located remotely, at distant portions of a distributed network, such as a LAN and/or the Internet, or within a dedicated system. Thus, it should be appreciated, that the components of the system can be combined into one or more devices, such as a server, communication device, or collocated on a particular node of a distributed network, such as an analog and/or digital telecommunications network, a packet-switched network, or a circuit-switched network. It will be appreciated from the preceding description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire, and fiber optics, and may take the form of acoustic or light waves, such as those generated during radio-wave and infra-red data communications.

While the flowcharts have been discussed and illustrated in relation to a particular sequence of events, it should be appreciated that changes, additions, and omissions to this sequence can occur without materially affecting the operation of the disclosed embodiments, configuration, and aspects.

A number of variations and modifications of the disclosure can be used. It would be possible to provide for some features of the disclosure without providing others.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the present disclosure includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as a program embedded on a processor or with a combination of software and/or hardware system.

Although the present disclosure describes components and functions implemented in the embodiments with reference to particular standards and protocols, the disclosure is not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments herein include a vehicle, comprising: an interior of the vehicle; an audio system provided in the interior, the audio system comprising: a digital audio controller (DAC); and two or more DAS modules in communication with the DAC, wherein each DAS module includes a speaker, and wherein each DAS module receives a digital sound signal from the DAC and converts the digital sound signal into sound through the speaker.

Any of the one or more above aspects, wherein the DAS module further comprises: a digital signal processor to receive and process the digital sound signal.

Any of the one or more above aspects, wherein the DAS module further comprises: an amplifier to amplify the converted digital sound signal for the speaker.

Any of the one or more above aspects, wherein the DAS module converts the digital sound signal into an analog sound signal.

Any of the one or more above aspects, wherein a first DAS module is in a first physical location and a second DAS module is in a second physical location, and wherein the first physical location is not in physical proximity in the interior with the second physical location.

Any of the one or more above aspects, wherein each DAS module comprises two or more speakers.

Any of the one or more above aspects, wherein each speaker consumes less than 4 watts power.

Any of the one or more above aspects, wherein each DAS is connected to the DAC over a ring network.

Any of the one or more above aspects, wherein each DAS receives power from a power connection located in physical proximity to the DAS module.

Any of the one or more above aspects, further comprising a second DAS module connected directly to the DAC.

Embodiments herein further include a method, comprising: creating a network comprising of a digital audio controller (DAC) and two or more DAS modules, wherein each DAS module includes a speaker, and wherein each DAS module receives a digital sound signal from the DAC and converts the digital sound signal into sound through the speaker; the DAC identifying each of the DAS modules; the DAC determining a configuration for the two or more DAS modules; the DAC receiving an audio input signal; the DAC configuring the received audio signal; the DAC addressing the configured audio signal for at least one of the two or more DAS module; and the DAC sending the addressed audio signal to the at least one of the two or more DAS module.

Any of the one or more above aspects, wherein the addressed audio signal is a digital audio signal.

Any of the one or more above aspects, wherein configuring the received audio signal comprises creating an effect for the receiving audio input signal.

Any of the one or more above aspects, further comprising the DAC identifying the speaker included with each of the DAS modules.

Any of the one or more above aspects, further comprising: the DAS module receiving the addressed audio signal; the DAS module configuring the addressed audio signal; the DAS module converting the addressed audio signal into an analog signal; the DAS module outputting the analog signal to the speaker; and the speaker outputting sound based on the analog signal.

Embodiments herein further include a non-transitory information storage media having stored thereon one or more instructions, that when executed by one or more processors, cause an audio system in a vehicle to perform a method, the method comprising: receiving a digital audio signal from a digital audio controller (DAC) over a fiber optic network at a DAS module, wherein the DAC sends the digital audio signal to two or more DAS modules in the interior of the vehicle; the DAS configuring the digital audio signal; the DAS converting the digital audio signal into an analog signal; and the DAS outputting the analog signal to a speaker associated with the DAS module, wherein the speaker outputs sound based on the analog signal.

Any of the one or more above aspects, wherein the digital audio signal is addressed to a digital signal processor associated with the DAS module.

Any of the one or more above aspects, wherein the digital audio signal includes information about an effect to the output sound to be created by the DAS module, and wherein the DAS module creates the effect when converting the digital audio signal.

Any of the one or more above aspects, wherein the fiber optic network is a ring network.

Any of the one or more above aspects, the method further comprising: the DAC identifying the DAS module; the DAC determining a configuration for two or more DAS modules including the DAS module; the DAC receiving an audio input signal; the DAC configuring the received audio signal; the DAC addressing the configured audio signal for the DAS module; and the DAC sending the addressed audio signal to the DAS module.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

The term "electric vehicle" (EV), also referred to herein as an electric drive vehicle, may use one or more electric motors or traction motors for propulsion. An electric vehicle may be powered through a collector system by electricity from off-vehicle sources, or may be self-contained with a battery or generator to convert fuel to electricity. An electric vehicle generally includes a rechargeable electricity storage system (RESS) (also called Full Electric Vehicles (FEV)). Power storage methods may include: chemical energy stored on the vehicle in on-board batteries (e.g., battery electric vehicle or BEV), on board kinetic energy storage (e.g., flywheels), and/or static energy (e.g., by on-board double-layer capacitors). Batteries, electric double-layer capacitors, and flywheel energy storage may be forms of rechargeable on-board electrical storage.

The term "hybrid electric vehicle" refers to a vehicle that may combine a conventional (usually fossil fuel-powered) powertrain with some form of electric propulsion. Most hybrid electric vehicles combine a conventional internal combustion engine (ICE) propulsion system with an electric propulsion system (hybrid vehicle drivetrain). In parallel hybrids, the ICE and the electric motor are both connected to the mechanical transmission and can simultaneously transmit power to drive the wheels, usually through a conventional transmission. In series hybrids, only the electric motor drives the drivetrain, and a smaller ICE works as a generator to power the electric motor or to recharge the batteries. Power-split hybrids combine series and parallel characteristics. A full hybrid, sometimes also called a strong hybrid, is a vehicle that can run on just the engine, just the batteries, or a combination of both. A mid hybrid is a vehicle that cannot be driven solely on its electric motor, because the electric motor does not have enough power to propel the vehicle on its own.

The term "rechargeable electric vehicle" or "REV" refers to a vehicle with on board rechargeable energy storage, including electric vehicles and hybrid electric vehicles.

What is claimed is:

1. A vehicle, comprising:
   an interior of the vehicle; and
   a modular audio system provided in the interior of the vehicle, the audio system comprising:
   an audio network backbone including a single strand of cable circling the interior of the vehicle;
   a digital audio controller (DAC) connected to the single strand of cable; and
   two or more digital signal processor (DSP), amp, speaker (DAS) modules connected to the single strand of cable at different locations in the interior of the vehicle, wherein each of the two or more DAS modules are in communication with the DAC via the connection to the single strand of cable, wherein each DAS module of the two or more DAS modules receives a digital sound signal from the DAC and converts the digital sound signal into sound through the corresponding speaker, and wherein the DAC identifies each of the two or more DAS modules connected to the single strand of cable without requiring a direct connection to the two or more DAS modules.

2. The vehicle of claim 1, wherein in each DAS module the digital signal processor receives and processes the digital sound signal.

3. The vehicle of claim 2, wherein in each DAS module the amplifier amplifies the converted digital sound signal for the speaker.

4. The vehicle of claim 3, wherein each DAS module converts the digital sound signal into an analog sound signal.

5. The vehicle of claim 4, wherein a first DAS module of the two or more DAS modules is in a first physical location inside the vehicle and a second DAS module of the two or more DAS modules is in a second physical location inside the vehicle, and wherein the first physical location is not in physical proximity in the interior with the second physical location.

6. The vehicle of claim 5, wherein each DAS module comprises two or more speakers.

7. The vehicle of claim 6, wherein each speaker of the two or more speakers consumes less than 4 watts power.

8. The vehicle of claim 7, wherein each DAS module is connected to the single strand of cable in parallel to one another along the audio network backbone.

9. The vehicle of claim 7, wherein each DAS module receives power from a power connection located in physical proximity to each DAS module.

10. The vehicle of claim 9, further comprising a third DAS module of the two more DAS modules connected directly to the DAC.

11. A method, comprising:
creating a modular audio network comprising an audio network backbone including a single strand of cable circling the interior of a vehicle, a digital audio controller (DAC) connected to the audio network backbone, and two or more digital signal processor (DSP), amp, speaker (DAS) modules connected to the single strand of cable at different locations in the interior of the vehicle, wherein each of the two or more DAS modules are in communication with the DAC via the connection to the single strand of cable, wherein each DAS module of the two or more DAS modules receives a digital sound signal from the DAC and converts the digital sound signal into sound through the corresponding speaker;
the DAC identifying each of the two or more DAS modules connected to the single strand of cable without requiring a direct connection to the two or more DAS modules;
the DAC determining a configuration for the two or more DAS modules;
the DAC receiving an audio input signal;
the DAC configuring the received audio input signal;
the DAC addressing the configured audio input signal for at least one DAS module of the two or more DAS modules; and
the DAC sending the addressed audio input signal to the at least one DAS module of the two or more DAS modules.

12. The method of claim 11, wherein the addressed audio input signal is a digital audio signal.

13. The method of claim 12, wherein configuring the received audio input signal comprises creating an effect for the received audio input signal.

14. The method of claim 13, further comprising the DAC identifying a signal type for the speaker included with each of the two or more DAS modules.

15. The method of claim 14, further comprising:
the at least one DAS module receiving the addressed audio input signal;
the at least one DAS module configuring the addressed audio input signal;
the at least one DAS module converting the addressed audio input signal into an analog signal;
the at least one DAS module outputting the analog signal to the speaker included with the at least one DAS module; and
the speaker included with the at least one DAS module outputting sound based on the analog signal.

16. A non-transitory information storage media having stored thereon one or more instructions, that when executed by one or more processors, cause an audio system in a vehicle to perform a method, the method comprising:
receiving a digital audio signal from a digital audio controller (DAC) over an audio network backbone including a single strand of cable circling the interior of the vehicle at a digital signal processor (DSP), amp, speaker (DAS) module, wherein the DAC sends the digital audio signal to two or more DAS modules connected at distinct locations along the single strand of cable circling the interior of the vehicle, and wherein the DAC identifies each of the two or more DAS modules connected to the single strand of cable without requiring a direct connection to the two or more DAS modules;
the DAS module configuring the digital audio signal;
the DAS module converting the digital audio signal into an analog signal; and
the DAS module outputting the analog signal to the speaker associated with the DAS module, wherein the speaker outputs sound based on the analog signal.

17. The media of claim 16, wherein the digital audio signal is addressed to the DSP associated with the DAS module.

18. The media of claim 17, wherein the digital audio signal includes information about an effect to the output sound to be created by the DAS module, and wherein the DAS module creates the effect when converting the digital audio signal.

19. The media of claim 18, wherein the audio network backbone including the single strand of cable is a fiber optic ring network.

20. The media of claim 19, the method further comprising:
the DAC identifying information about the DAS module;
the DAC determining a configuration for the two or more DAS modules including the DAS module based on the information about the identified DAS module;
the DAC receiving an audio input signal;
the DAC configuring the received audio input signal;
the DAC addressing the configured audio input signal for the DAS module; and
the DAC sending the addressed audio input signal to the DAS module.

* * * * *